United States Patent [19]
Miyasaka et al.

[11] Patent Number: 5,651,694
[45] Date of Patent: Jul. 29, 1997

[54] FLAT CABLE WITH CONDUCTOR ENDS CONNECTABLE TO CONNECTOR

[75] Inventors: Eiichi Miyasaka; Takao Sugita; Chihiro Nakagawa, all of Tokyo; Hiromasa Akaho, Yokohama; Kenji Watanabe, Yokohama; Takafumi Kishi, Yokohama, all of Japan

[73] Assignees: Mitsubishi Cable Industries Ltd., Amagasaki; Nissan Motor Co. Ltd., Yokohama, both of Japan

[21] Appl. No.: 507,084

[22] Filed: Jul. 26, 1995

[30] Foreign Application Priority Data

Jul. 29, 1994 [JP] Japan ..................... 6-197898
Sep. 13, 1994 [JP] Japan ..................... 6-246875

[51] Int. Cl.$^6$ ............................................ H01R 9/07
[52] U.S. Cl. .................................. 439/492; 439/77
[58] Field of Search ........................ 439/492–499, 439/67, 77; 174/117 R, 117 F, 117 FF

[56] References Cited

U.S. PATENT DOCUMENTS 4,934,956  6/1990  Conti ........................ 439/492
5,265,322  11/1993  Fisher et al. ............... 439/492

FOREIGN PATENT DOCUMENTS 3155070  7/1991  Japan ........................ 439/492
4206374  7/1992  Japan ........................ 439/492

Primary Examiner—David L. Pirlot
Attorney, Agent, or Firm—Varndell Legal Group

[57] ABSTRACT

A flat cable including a plurality of conductor strips which are formed by punching a single metal foil and are embedded within an insulating sheet, in which at an end portion of the flat cable, bifurcated portions are folded back one on another such that end terminals of conductor strips of one bifurcated portion are inserted between end terminals of conductor strips of another bifurcated portion, so that an order in which end terminals of the conductor strips are aligned can be changed. Therefore, an electric connection between connectors requiring crossings of conductor strips can be established by a single flat cable.

5 Claims, 4 Drawing Sheets

FLAT CABLE WITH CONDUCTOR ENDS CONNECTABLE TO CONNECTOR

BACKGROUND OF THE INVENTION

1. Field of the Invention

The present invention relates to a flat cable comprising a plurality of foil-like conductor strips having end portions connectable to terminals of a connector, and an insulating sheet in which said foil-like conductor strips are embedded in a manner such that the conductor strips are electrically isolated from each other.

2. Related Art Statement

The flat cable of kind mentioned in the preamble has been widely used in automobiles for connecting various electric parts. In case of manufacturing a flat cable, a metal foil is punched to form a plurality of foil-like conductor strips and then these conductor strips are sandwiched between insulating films made of synthetic resin such as PET to form a laminated structure.

Recently the number of electric parts has been increased and the circuit arrangement has become very complicated. Therefore, it has become difficult to establish an electrical connection between connectors by means of a single flat cable. For instance, in automobiles, plural kinds of flat cables having different structures have been used. This results in that a design of a circuit arrangement, manufacturing and cable fitting operation are liable to be complicated and the number of operation steps is increased so that an efficiency of manufacture is decreased. Therefore, a manufacturing cost is increased.

FIG. 1 is a plan view showing a circuit arrangement, in which a first connector 1 includes terminals a1, a2, a3, a4 and a5 aligned in this order and second connector 2 has terminals b5, b4, b1, b2 and b3 aligned in this order. It should be noted that terminals of the first and second connectors 1 and 2 having the same suffixes have to be connected to each other. That is to say, the terminal a1 of the first connector 1 should be connected to the terminal b1 of the second connector 2, the terminal a2 of the first connector 1 has to be connected to the terminal b2 of the second connector 2, and so on. If the corresponding terminals of the first and second connectors 1 and 2 are connected by means of a single flat cable Fc, the flat cable should have conductor strips c1–c5 some of which are crossed with each other. That is, the conductor strips c4 and c5 have to be crossed with the other conductors c1–c3 and further the conductor strips c4 and c5 should be crossed with each other as illustrated in FIG. 1.

The circuit arrangement shown in FIG. 1 is sometimes used in automobiles. In automobiles, a main harness is commonly used for different kinds of cars or at different portions of a car in order to reduce the number of different kinds of parts and a manufacturing cost. For instance, an inner door unit to be connected to the terminals a4 and a5 situates below the terminals b1–b3. In such a basic structure or specification, it is required to arrange the terminals b4 and b5 above the terminals b1–b3 in another kind of car or specification due to a layout within the inner door space.

In such a case, it is impossible to perform the connection between the connectors 1 and 2 by means of a single known flat cable, and at least two flat cables are required, one having a pattern for connecting the terminals a1, a2 and a3 to the terminals b1, b2 and b3, respectively and the other having a pattern for connecting the terminals a4 and a5 to the terminals b4 and b5, respectively.

In a known flat cable illustrated in FIG. 2, one end of the flat cable 6 includes end terminals connectable to terminals d1, d2, d3, d4, d5 and d6 of a first connector 3, and the other end of the flat cable has a first set of end terminals connectable to terminals e4 and e5 of a second connector 4 and a second set of end terminals connectable to terminals e3, e1, e2 and d6 of a third connector 5. Also in this case, foil-like conductor strips of the flat cable 6 have to be crossed with each other, so that it is practically difficult to perform the electrical connection between the first connector 3 and the second and third connectors 4 and 5 by means of a single flat cable. That is, in order to connect the first connector 3 to the second and third connectors 4 and 5, it is required no use a first flat cable connecting the terminals d4 and d5 of the first connector 3 to the terminals e4 and e5 of the second connector 4 and a second flat cable connecting the terminals d3, d1, d2 and d6 of the first connector 3 to the terminals e3, e1, e2 and e6 of the third connector 5.

As explained above, when an electric connection between connectors requires crossings of conductor strips, it is difficult to perform an electric connection by means of a single flat cable, so that a plurality of flat cables have to be used. Therefore, when a circuit arrangement becomes complicated, a larger number of flat cables of different structures are required. Therefore, the number of steps in designing is increased and the fitting operation of flat cables becomes cumbersome. Moreover, when the number of kinds of flat cables is increased, the number of blanking dies for manufacturing the flat cables is increased accordingly, and thus the manufacturing cost is increased.

SUMMARY OF THE INVENTION

The present invention has for its object to provide a novel and useful flat cable which can establish an electrical connection between connectors even if the electrical connection requires crossings of conductor strips.

According to a first aspect of the invention, a flat cable comprising a plurality of foil-like conductor strips having end portions connectable to terminals of a connector, and an insulating sheet in which said foil-like conductor strips are embedded in such a manner that the conductor strips are electrically isolated from each other, the improvement being characterized in that at least one end portion of the flat cable includes a bifurcated portion which has been folded back about a line extending in a direction perpendicular to an edge of the end portion such that an order of end terminals of the foil-like conductor strips are changed.

In a preferable embodiment of the flat cable according to the first aspect of the invention, a distance between adjacent end terminals of the foil-like conductor strips is widened to form a space, and said at least one bifurcated portion has been folded back such that at least one end terminal of at least one foil-like conductor strip of the bifurcated portion is placed in said space.

According to a second aspect of the invention, a flat cable comprising a plurality of foil-like conductor strips having end portions connectable to terminals of a connector, and an insulating sheet in which said foil-like conductor strips are embedded in such a manner that the conductor strips are electrically isolated from each other, the improvement being characterized in that there are formed a plurality of bifurcated portions at least one end portion of the flat cable, and said plurality of bifurcated portions are folded back such that end terminals of foil-like conductor strips of said plurality of bifurcated portions are arranged one on another to form an end portion including plural end terminal arrays, said end portion being connectable to a connector including plural terminal arrays.

In a preferable embodiment of the flat cable according to the second aspect of the invention, said end portion includes plural connector housings each accommodating end terminal arrays of respective bifurcated portions, said plural connector housings being able to be coupled with said connector by clamping.

DESCRIPTION OF THE PREFERRED EMBODIMENT

Figure 1:
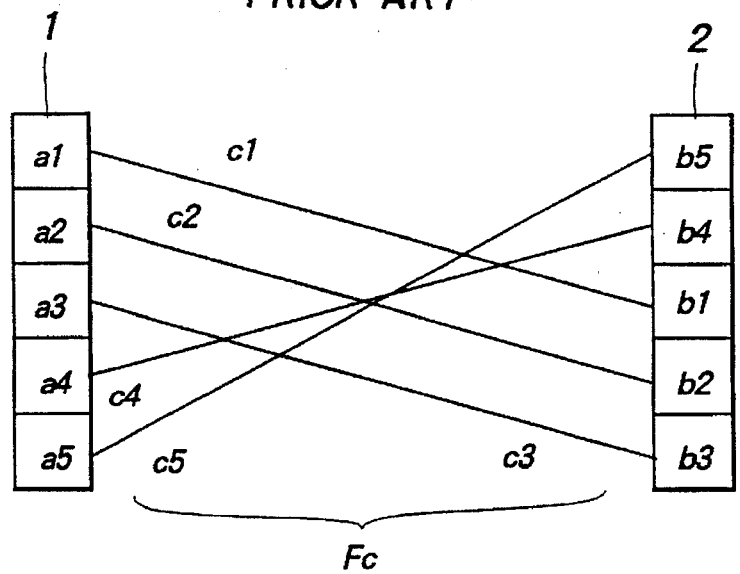
FIG. 1 is a schematic view showing an electrical connection including crossings of conductors.
Figure 2:
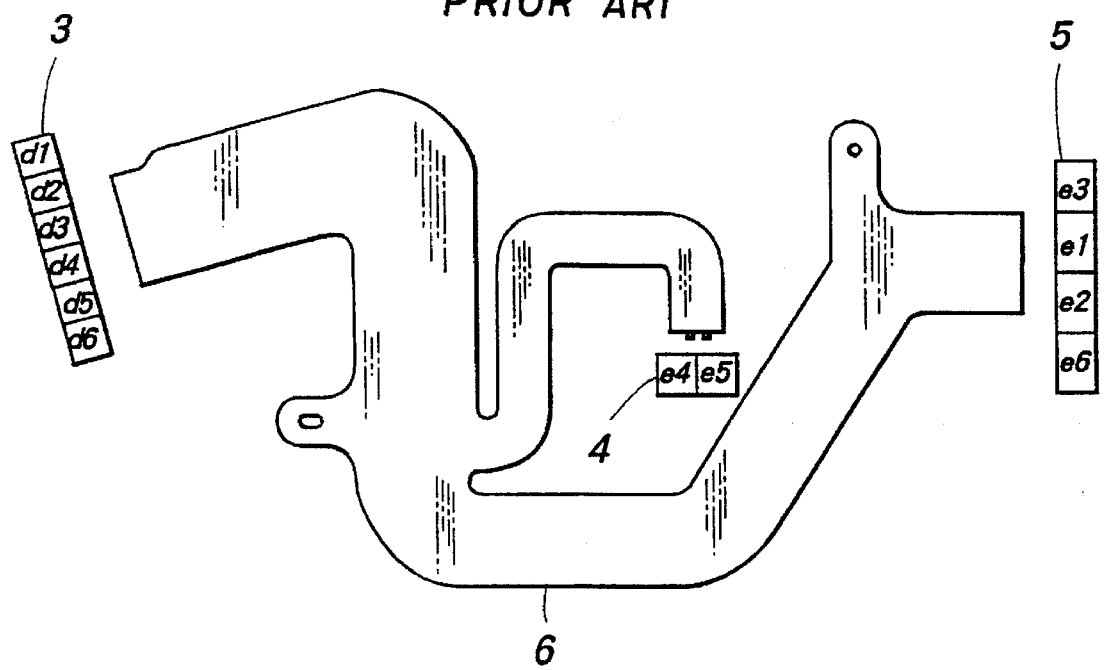
FIG. 2 is a plan view illustrating a known flat cable.
Figure 3:
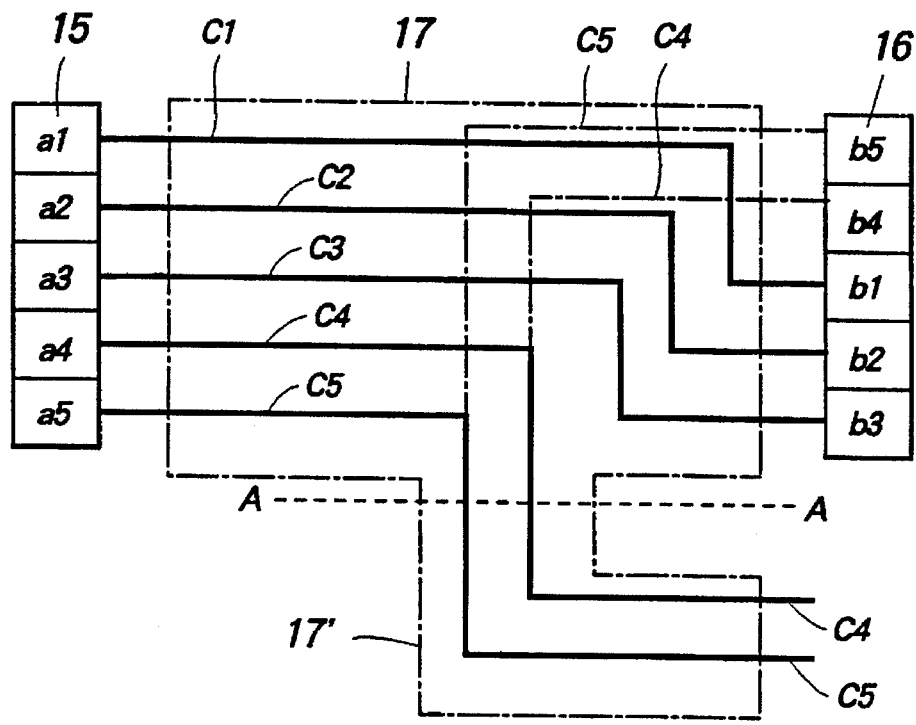
FIG. 3 is a schematic view depicting a principal construction of the flat cable according to the invention.

FIG. 3 is a schematic view showing a principal construction of the flat cable according to the invention. A connector 15 in FIG. 3 is identical with the connector 1 shown in FIG. 1 and includes terminals a1, a2, a3, a4 and a5 aligned in this order. A connector 16 is identical with the connector 2 in FIG. 1 and comprises terminals b5, b4, b1, b2 and b3 arranged in this order. It should be noted that the terminals having the same numerical suffixes are to be connected to each other by means of a flat cable 17 including foil-like conductor strips c1, c2, c3, c4 and c5.

At one end portion of the flat cable 17, end terminals of the conductor strips c1, c2, c3, c4 and c5 are arranged in this order at a pitch which is identical with a pitch at which the terminals a1, a2, a3, a4 and a5 of the connector 15 are aligned. At the other end portion of the flat cable 17, end terminals of conductor strips c1, c2 and c3 form a first set of end terminals and end terminals of the conductor strips c4 and c5 form a second set of end terminals as a bifurcated end portion 17'. The end terminals of the conductor strips c1, c2 and c3 are arranged at a pinch at which the terminals b1–b5 of the connector 16 are arranged, and the end terminals of the conductor strips c4 and c5 of the bifurcated end portions 17' are separated from each other by said pitch.

According to the invention, the bifurcated end portion 17' is folded back along a line A—A over the end terminal portion of the conductor strips c1–c3 as shown by chain lines in FIG. 3 such that the end terminals of the conductor strips c4 and c5 are positioned above the end terminals of the conductor strips c1–c3. In this manner, the end terminals of the conductor strips c5, c4, c1, c2 and c3 are aligned in this order at said pitch, so that they can be connected to the terminals b5, b4, b1, b2 and b3 of the connector 16.

In the flat cable according to the invention, at one end portion the end terminals of the conductor strips c1, c2, c3, c4 and c5 are arranged in this order and at the other end portion, the end terminals of the conductor strips c5, c4, c1, c2 and c3 are arranged in this order. Therefore, a given electrical connection between the connectors 15 and 16 including crossings of conductor strips can be established by the single flat cable 17.

Figure 4:
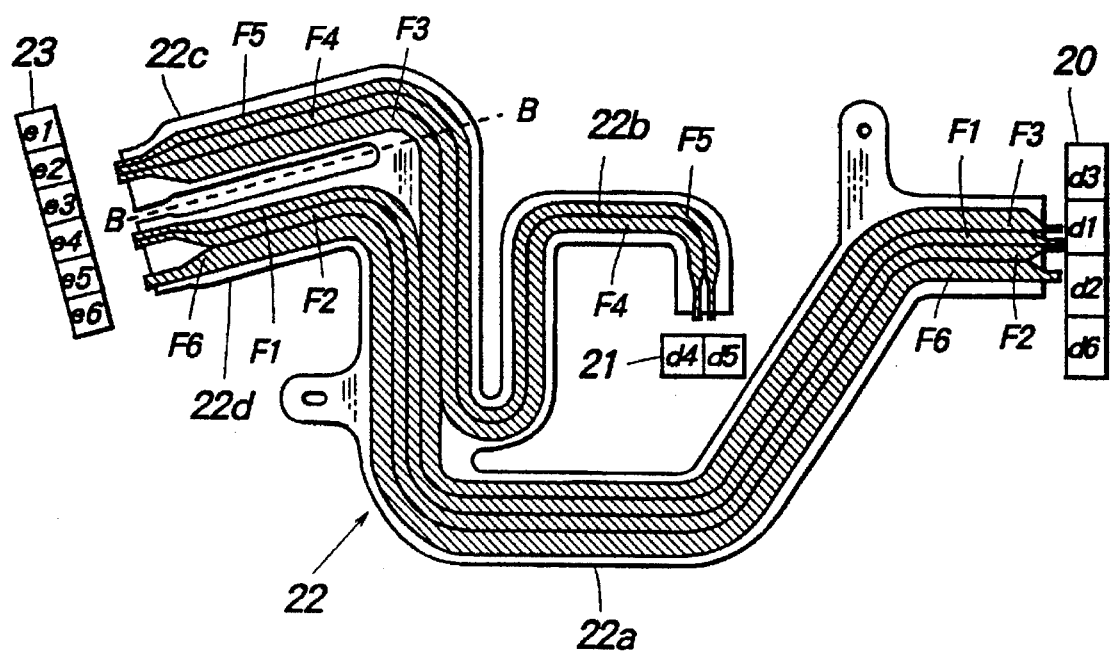
FIG. 4 is a schematic plan view showing a first embodiment of the flat cable according to the invention.
Figure 5:
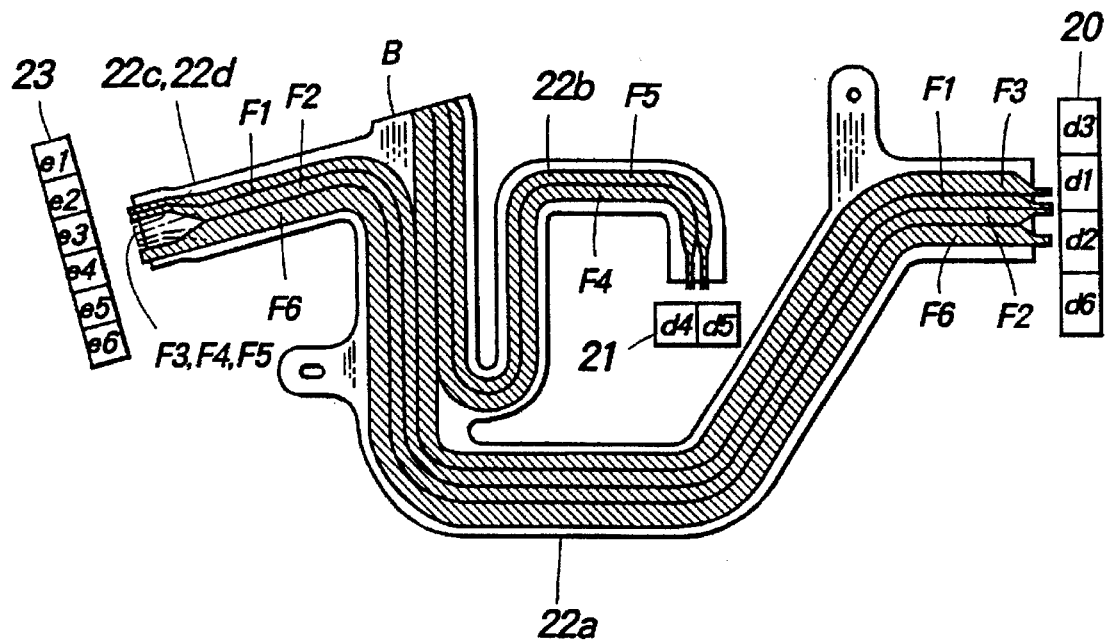
FIG. 5 is a schematic plan view representing a second embodiment of the flat cable according to the invention.

FIGS. 4 and 5 are schematic plan views depicting a first embodiment of the flat cable according to the invention. As shown in FIG. 4, a flat cable 22 of the present embodiment is used to establish an electrical connection between first and second connectors 20 and 21 and a third connector 23, and comprises a plurality of foil-like conductor strips F1, F2, F3–F6. The first connector 20 includes terminals d3, d1, d2 and d6 arranged in this order, the second connector 21 has terminals d4 and d5 and the third connector 23 comprises terminals e1, e4, e3, e4, e5 an e6 aligned in this order. The flat cable 22 comprises a main portion 22a including the conductor strips F3, F1, F2 and F6, a first bifurcated end portion 22b including the conductor strips F5 and F4, a second bifurcated portion 22c including the conductor strips F5, F4 and F3, and a third bifurcated portion 22d including the conductor strips F1, F2 and F6.

End terminals of the conductor strips of the main portion 22a are to be connected to the terminals of the first connector 20 and end terminals of the conductor strips of the first bifurcated portion 22b are to be connected to the terminals of the second connector 21. End terminals of the conductor strips F5, F4 and F3 of the second bifurcated portion 22b and end terminals of the conductor strips F1, F2 and F6 of the third bifurcated portion 22d are to be connected to the terminals of the third connector 23. In the third portion 22d, the conductor strips F1, F2 and F6 are arranged such that between the end terminals of the conductor strips F2 and F6, there is formed a space having a such width that three end terminals of the conductor strips can be inserted therebetween.

According to the invention, the second bifurcated portion 22b is folded back about a line B—B over the third bifurcated portion 22d such that the end terminals of the conductor strips F3, F4 and F5 of the second bifurcated portion 22b are inserted into said space formed between the end terminals of the conductor strips F2 and F6 of the third bifurcated portion 22d. It should be noted that said line A—A should extend perpendicular to an edge of the end terminals. FIG. 5 shows the flat cable 22 after the above mentioned folding operation. As shown in FIG. 5, at the end portion of the flat cable 22 to be connected to the third connector 23, the end terminals of the conductor strips F1, F2, F3, F4, F5 and F6 are aligned in this order, so that these end terminals of the conductor strips F1–F6 can be connected to the corresponding terminals e1–e6 of the third connector 23. It should be noted that in the present embodiment, the end terminals of the conductor strips F1–F6 at the end portion connectable to the third connector 23 are aligned on a single plane. After that, the end terminals of the conductor strips F1–F6 are connected to metal terminals in a synthetic resin housing not shown.

Figure 6:
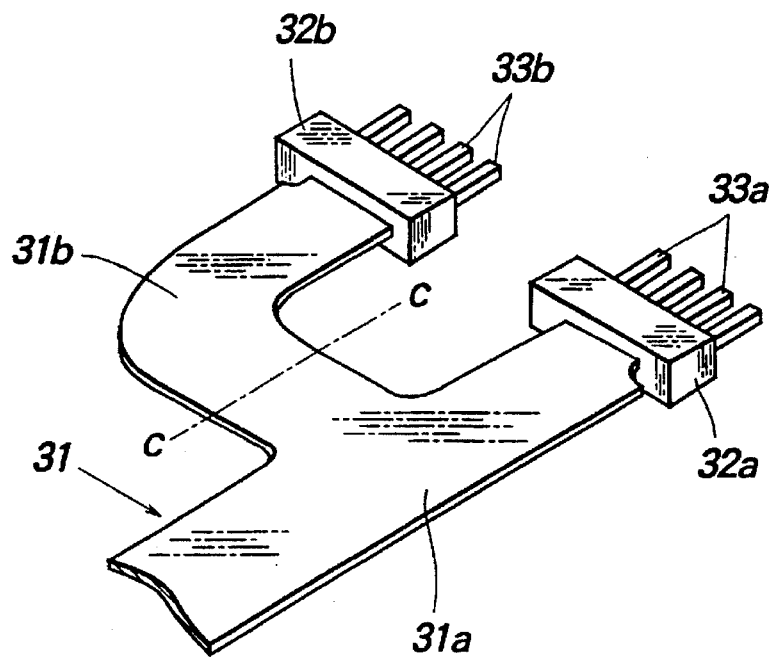
FIG. 6 is a perspective view illustrating an end portion of a third embodiment of the flat cable according to the invention prior to folding operation.
Figure 7:
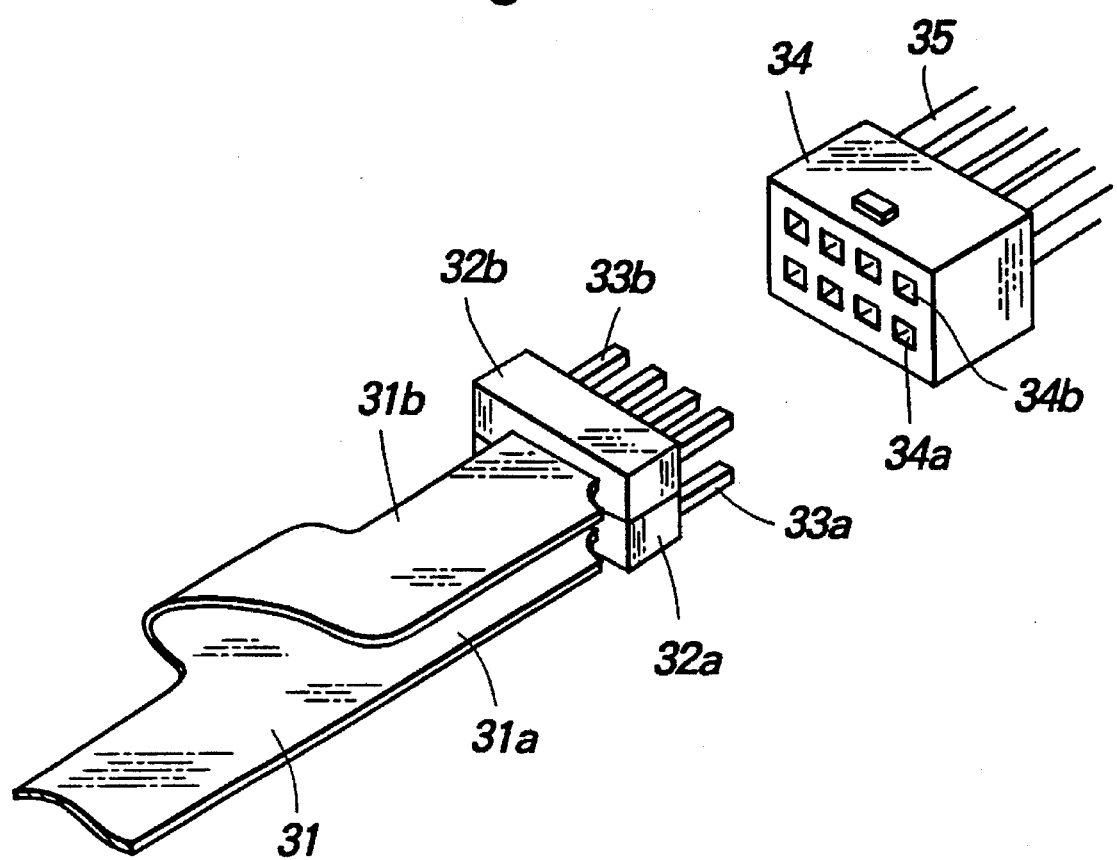
FIG. 7 is a perspective view showing the end portion after folding operation.

FIGS. 6 and 7 illustrate a second embodiment of the flat cable according to the invention. In the first embodiment, after folding back the bifurcated portion 22b over the third bifurcated portion 22c such that the end terminals of the conductor strips F1–F6 are aligned in a given order, the end terminals are connected to the metal terminals. In the present embodiment, prior to the folding operation, end terminals of bifurcated portions 31a and 31b of a flat cable 31 are first connected to metals 33a and 33b within connector housings 32a and 32b, respectively as illustrated in FIG. 6. The end terminals of the conductor strips may be connected to respective metal terminals 33a and 33b by means of ultrasonic welding. After welding the end terminals of the conductor strips to the metal terminals 33a and 33b, connected portions are fixed by synthetic resin molding to form the connector housings 32a and 32b.

Then the bifurcated portion 31b is folded back over the bifurcated portion 31a about a line C—C in FIG. 6 such that the connector housing 32b is place on the connector housing 32a as depicted in FIG. 7. Therefore, the metal terminals 33a and 33b form a two array connector. It should be noted that the connector housings 32a and 32b have a same width, so that these connector housings can form aligned side walls. Furthermore, the connector housings 32a and 32b may be accommodated within a single housing by synthetic resin molding. As shown in FIG. 7, upon connecting the flat cable to a connector 34, the metal terminals 33a and 33b are inserted into corresponding holes 34a and 34b arranged in two arrays. In respective holes 34a and 34b, there are provided metal receptacles and these metal receptacles are connected to ends of respective conductors 35. Therefore, by inserting the metal terminals 33a and 33b into the holes 34a and 34b, the metal terminals can be inserted into corresponding metal receptacles of the connector 34. It should be noted that the connector housings 32a and 32b are constructed such that the connector housings can be clamped into the connector 34. Therefore, by clamping the connector housings 32a, 32b and the connector 34 together, the conductor strips of the flat cable can be connected to given conductors 35.

The present invention is not limited to the embodiments explained above, but many modifications and alternations may be conceived by those skilled in the art within the scope of the invention. For instance, in the embodiment shown in FIGS. 6 and 7, the two bifurcated portions of the flat cable are folded one on the other, but according to the invention more than two bifurcated portions may be folded one on another to form a connector portion in which more than two connector housings are place one on another. That is, according to the invention, a plurality of end terminal arrays may be formed. Similarly, in the first embodiment, a bifurcated portion may be folded back about a plurality of lines.

As explained above, in the flat cable according to the invention, by folding back a bifurcated portion of the flat cable such that an order in which the end terminals of the conductor strips are arranged can be changed. Further the bifurcated portion of the flat cable is folded such that a plurality of connector housings are arranged one on another. Therefore, a design of circuit arrangements can be simplified and a flat cable including crossings of conductor strips can be simply manufactured. Then, a manufacturing cost of flat cables can be decreased. Furthermore, the number of kinds of flat cables to be prepared for establishing desired electrical connections between various connectors can be reduced.

What is claimed is:

1. A flat cable comprising a plurality of foil-like conductor strips having end terminals connectable to terminals of a connector, and an insulated sheet in which said foil-like conductor strips except for said end terminals are embedded such that the conductor strips are electrically isolated from each other, wherein at least one space is provided in said end terminals of the foil-like conductor strips, and a part of said end portion of the flat cable which does not include said space is folded back along a line parallel to the foil-like conductor strips such that an end terminal of at least one foil-like conductor strip of said folded part of the end portion of the flat cable is placed in said space, so that an order of said end terminals of the foil-like conductor strips is changed, and end terminals of all the foil-like conductor strips are aligned in a single plane.

2. A flat cable according to claim 1, wherein said space is formed in the end portion of the flat cable at a position which is remote from said folded part of the end portion.

3. A flat cable according to claim 1, wherein said space is formed between end terminals of adjacent foil-like conductor strips.

4. The flat cable according to claim 1, wherein said plurality of conductor strips includes first, second, and third foil conductor strips and said conductor strips are initially arranged in said end of said flat cable in an order of said second conductor strip, said first conductor strip and said third conductor strip with spacing provided between said first, second and third conductor strips, and said fold is arranged between said second and first conductor strips; so that after folding said end, said conductor strips are arranged in a straight line in an order said first conductor strip, said second conductor strip, and third conductor strip.

5. A flat cable having an end for connecting to a connector, said flat cable including a plurality of conductor strips insulated from each other, an end where said plurality of conductor strips terminate, and a section where said plurality of conductor strips are arranged in parallel; said end of said flat cable including a fold in a direction parallel to said plurality of conductor strips, said plurality of conductor strips are arranged in said end of said flat cable; so that when the end of said flat cable is folded along said fold, said plurality of conductor strips in said end are in a single plane.

* * * * *